(12) United States Patent
Obara

(10) Patent No.: US 7,290,190 B2
(45) Date of Patent: Oct. 30, 2007

(54) SEMICONDUCTOR INTEGRATED CIRCUIT WITH A TEST CIRCUIT

(75) Inventor: Teruhisa Obara, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 380 days.

(21) Appl. No.: 10/649,765

(22) Filed: Aug. 28, 2003

(65) Prior Publication Data

US 2004/0049723 A1    Mar. 11, 2004

(30) Foreign Application Priority Data

Sep. 2, 2002    (JP) .............................. 2002-257007

(51) Int. Cl.
*G01R 31/28*    (2006.01)
(52) U.S. Cl. ...................... 714/726; 714/729
(58) Field of Classification Search ................ 714/724, 714/726

See application file for complete search history.

(56) References Cited

U.S. PATENT DOCUMENTS

| | | | | |
|---|---|---|---|---|
| 4,499,454 A | * | 2/1985 | Shimada ........................ | 341/58 |
| 5,012,240 A | * | 4/1991 | Takahashi et al. ............ | 341/101 |
| 5,119,379 A | * | 6/1992 | Dara ............................ | 714/46 |
| 5,247,652 A | * | 9/1993 | Uda ............................. | 710/71 |
| 5,926,120 A | * | 7/1999 | Swenson et al. ............. | 341/100 |
| 6,014,763 A | * | 1/2000 | Dhong et al. ................. | 714/724 |
| 6,169,500 B1 | * | 1/2001 | Eriksson et al. .............. | 341/100 |
| 6,242,269 B1 | * | 6/2001 | Whetsel ........................ | 438/11 |
| 6,466,247 B1 | * | 10/2002 | Sugano et al. ............... | 347/250 |
| 2003/0056183 A1 | * | 3/2003 | Kobayashi ...................... | 716/4 |

FOREIGN PATENT DOCUMENTS

| | | |
|---|---|---|
| JP | 2000258500 A | 9/2000 |
| JP | 2004-61340 | 2/2004 |

OTHER PUBLICATIONS

The Free Dictionary, Farlex, computing-dictionary.thefreedictionary.com/.*
Philips, 74HC/HCT166 8-bit parallel-in/serial-out shift register Dec. 1990, Philips Semiconductor, pp. 4-6.*

* cited by examiner

*Primary Examiner*—Cynthia Britt
*Assistant Examiner*—Saqib Siddiqui
(74) *Attorney, Agent, or Firm*—Rabin & Berdo, P.C.

(57) ABSTRACT

A shift scan chain includes logic circuit blocks 11-18 and scan registers 21-28 connected at stages succeeding them. The shift chain is divided into divisional chains including the scan registers 21-24 and the scan registers 25-28. In the test operation mode of a semiconductor integrated circuit, test input data TI are supplied in synchronism with a multiplied clock signal CKD at a frequency twice of that of a clock signal CK. The test input data TI are converted by a serial/parallel conversion circuit 40 into parallel data S41 and S42, which are respectively supplied to the head scan registers 21 and 25 of the corresponding divisional chains. The length of each divisional chains becomes ½, and a test time period can be shortened.

12 Claims, 3 Drawing Sheets

SEMICONDUCTOR INTEGRATED CIRCUIT WITH A TEST CIRCUIT

BACKGROUND OF THE INVENTION

1. Field of the Invention

The present invention relates to a semiconductor integrated circuit having a test circuit based on scan registers, and a method of testing the semiconductor integrated circuit.

2. Description of the Related Art

As a technique for testing a semiconductor integrated circuit, there has been one called "shift scan system" wherein scan registers are inserted among logic circuit blocks which perform the functional operations of the integrated circuit, and in the test mode of the integrated circuit, the scan registers are connected in the shape of a chain so as to supply testing data to the respective logic circuit blocks and to derive output data from them.

The test circuit of such a shift scan system, however, has had the problem that, as the number of the logic circuit blocks becomes larger, the number of the scan registers to constitute the scan chain enlarges more, so a long time is expended in inputting and outputting the test data.

A semiconductor integrated circuit having a test circuit is disclosed in Japanese unexamined published patent application JP-A-2000-258500.

The semiconductor integrated circuit is constructed of a circuit to-be-tested 102, scan data input terminals 151, 152, scan data output terminals 161, 162, a connection alteration circuit 103, and a code compression circuit 104.

The circuit to-be-tested 102 has scan chains 110, 120, 130, 140, in which scan registers 111-113, 121-123, 131-133, 141-143 are respectively connected so as to be capable of inputting and outputting scan data. Besides, the circuit to-be-tested 102 has partial circuits 171, 172 which are independent like combinational circuits. Here, the scan chains 110, 120 and those 130, 140 belong to the partial circuit 171 and the partial circuit 172, respectively.

The connection alteration circuit 103 branches the scan data input terminal 151 to the scan chains 110 and 130 at a branch point 153, and branches the scan data input terminal 152 to the scan chains 120 and 140 at a branch point 154. The code compression circuit 104 takes the exclusive logic of the scan chains 110 and 130 by a logic gate 163 and delivers it to the scan data output terminal 161, and takes the exclusive logic of the scan chains 120 and 140 by a logic gate 164 and delivers it to the scan data output terminal 162.

With such a semiconductor integrated circuit, the scan data inputted to, for example, the scan data input terminal 151 is simultaneously supplied to the two scan chains 110, 130. Besides, the scan data transferred by successively shifting along the scan chains 110, 130 have their exclusive logic taken by the logic gate 163, and the resulting data is outputted from the scan data output terminal 161. Thus, the test of the scan chains 110-140 being the circuit to-be-tested 102 can be performed in a short time.

As stated before, the semiconductor integrated circuit of the conventional shift scan system has had the problem that, with the enlargement of a circuit scale, a long time is expended in inputting and outputting test data. On the other hand, with the semiconductor integrated circuit disclosed in the above Japanese patent laid open, the same scan data is inputted to the two scan chains 110, 130, and any desired data cannot be held in the individual scan registers 111-113, 131-133. It is consequently impossible to test the operation of each logic circuit by supplying any desired test data to the logic circuit.

SUMMARY OF THE INVENTION

A semiconductor integrated circuit of the present invention includes m scan chains (wherein m is an integer greater than 1), a serial/parallel conversion circuit and a parallel/serial conversion circuit. Each of the scan chains includes logic circuits and scan registers connected alternately in series. The scan registers are operated in response to a clock signal. Each of the scan chains includes a first logic circuit having a data input terminal, a first scan register connected to the first logic circuit and a last scan register having an output terminal. The first scan register has a test input terminal. The serial/parallel conversion circuit is connected to the test input terminals of the first scan registers of the scan chains. The serial/parallel conversion circuit converts serial data into parallel data in response to a multiplied clock signal having a frequency being m times of that of the clock signal. The parallel/serial conversion circuit is connected to the output terminals of the last scan registers of the scan chains. The serial/parallel conversion circuit converts parallel data received from the scan chains into serial data in response to the multiplied clock signal.

DESCRIPTION OF PREFERRED EMBODIMENTS OF THE INVENTION

First Embodiment

Figure 1:
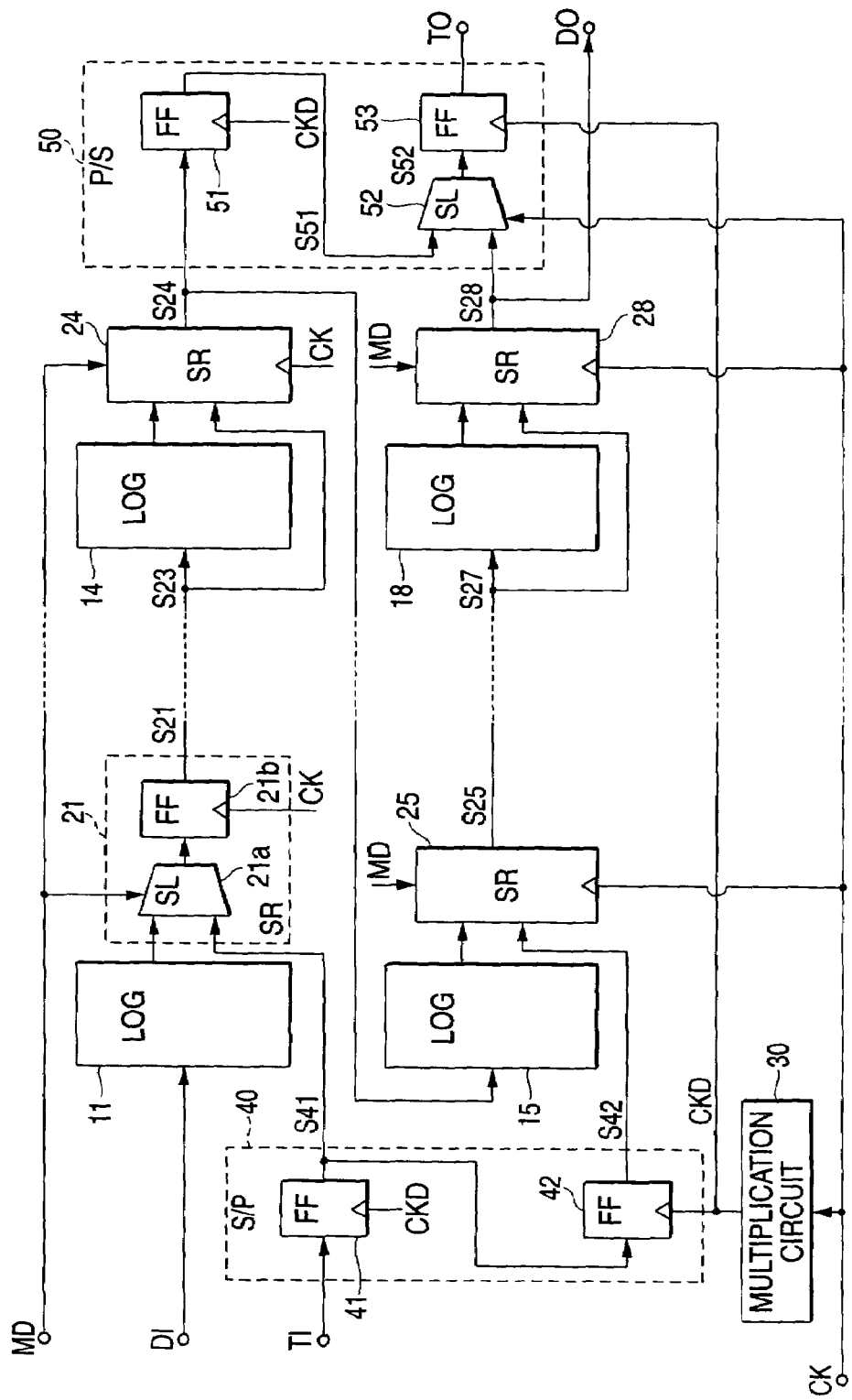
FIG. 1 is a block diagram of a semiconductor integrated circuit showing the first embodiment of the present invention.

FIG. 1 is a block diagram of a semiconductor integrated circuit showing the first embodiment of the present invention.

The semiconductor integrated circuit has a test circuit of shift scan system, and it includes (for example, eight) logic circuit blocks 11-18 which perform the functional operations of the integrated circuit, scan registers 21-28 which are respectively connected to the output nodes of the logic circuit blocks 11-18, a multiplication circuit 30 which generates from a clock signal CK a multiplied clock signal CKD at a frequency being double higher than that of the clock signal CK, a serial/parallel conversion circuit (S/P) 40, and a parallel/serial conversion circuit (P/S) 50.

All the scan registers 21-28 are similarly constructed. As shown in the scan register 21 by way of example, each scan register is configured of a selector (SL) 21a which changes over input signals in accordance with a mode signal MD, and a flip-flop (FF) 21b which holds and delivers the signal selected by the selector 21a, at the timings of the clock signal CK.

Besides, the serial/parallel conversion circuit 40 converts test input data TI serially inputted in synchronism with the multiplied clock signal CKD generated by the multiplication circuit 30, into parallel data S41, S42, which are then delivered. This serial/parallel conversion circuit 40 is constructed by connecting two flip-flops 41, 42 in cascade. The test input data TI is supplied to the input node of the flip-flop 41 of the initial stage, and the signals of the input nodes of the flip-flops 41, 42 are held and delivered in accordance with the same multiplied clock signal CKD. The parallel data S41, S42 are respectively delivered from the output nodes of the flip-flops 41, 42.

Input data DI is supplied to the input node of the logic circuit block 11 of the initial stage, and the output node of this logic circuit block 11 is connected to the first input node of the selector 21a of the scan register 21. Besides, the second input node of the selector 21a of the scan register 21 is supplied with the parallel data S41 of the serial/parallel conversion circuit 40.

A signal S21 delivered from the scan register 21 is supplied to the input node of the logic circuit block 12, not shown, of the succeeding stage and the second input node of the scan register 22, not shown, and the output signal of this logic circuit block 12 is supplied to the first input node of the scan register 22.

Likewise, the signal S22 of the scan register 22 is supplied to the logic circuit block 13 and the second input node of the scan register 23, and the output signal of this logic circuit block 13 is supplied to the first input node of the scan register 23. Further, the signal S23 of the scan register 23 is supplied to the logic circuit block 14 and the second input node of the scan register 24, and the output signal of this logic circuit block 14 is supplied to the first input node of the scan register 24.

The signal S24 of the scan register 24 is supplied to the logic circuit block 15, and the output signal of this logic circuit block 15 is supplied to the first input node of the scan register 25. Besides, the second input node of the scan register 25 is supplied with the parallel data S42 of the serial/parallel conversion circuit 40.

Further, the signal S25 of the scan register 25 is supplied to the logic circuit block 16, not shown, and the second input node of the scan register 26, not shown, and the output signal of this logic circuit block 16 is supplied to the first input node of the scan register 26. The signal S26 of the scan register 26 is supplied to the logic circuit block 17, and the second input node of the scan register 27, and the output signal of this logic circuit block 17 is supplied to the first input node of the scan register 27.

The signal S27 of the scan register 27 is supplied to the logic circuit block 18, and the second input node of the scan register 28, and the output signal of this logic circuit block 18 is supplied to the first input node of the scan register 28. The signal S28 of the scan register 28 is outputted as output data DO, and is also inputted to the parallel/serial conversion circuit 50 together with the signal S24 of the scan register 24.

The parallel/serial conversion circuit 50 outputs the signals S24, S28 inputted in parallel, as serial test output data TO in accordance with the multiplied clock signal CKD. This parallel/serial conversion circuit 50 is configured of a flip-flop 51 which holds the signal S24 at the timing of the multiplied clock signal CKD, a selector 52 which selects either of the signal S28 and a signal S51 delivered from the flip-flop 51, on the basis of the level "H" or "L" of the clock signal CK, and a flip-flop 53 which holds a signal S52 delivered from the selector 52 and then delivers it as the test output data TO at the timings of the multiplied clock signal CKD.

Figure 2:
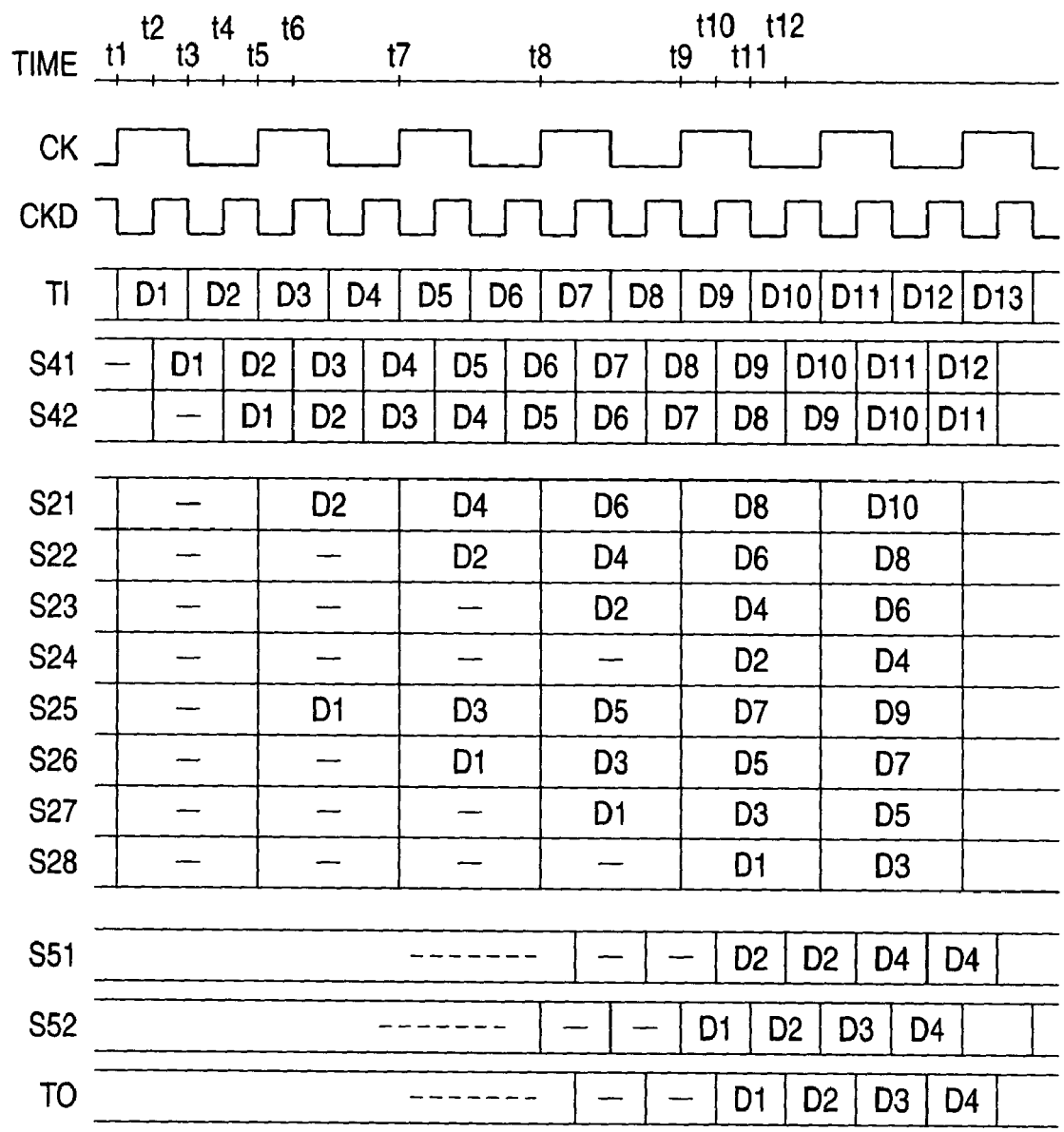
FIG. 2 is a timing chart showing the operation of the first embodiment in the test mode thereof.

FIG. 2 is a timing chart showing the operation of the semiconductor integrated circuit in FIG. 1 in the test mode thereof. Now, the operation in FIG. 1 will be described with reference to FIG. 2. By the way, in the test mode, all the scan registers 21-28 are changed-over to the second input nodes by the mode signal MD.

The clock signal CK in FIG. 1 is supplied to the respective scan registers 21-28, and it is also supplied to the multiplication circuit 30, whereby the multiplied clock signal CKD of the double frequency is generated as shown in FIG. 2. The generated multiplied clock signal CKD is supplied to the respective flip-flops which are included in the serial/parallel conversion circuit 40 and the parallel/serial conversion circuit 50.

Data D1, D2, D3, . . . are successively inputted as the test input data TI to the serial/parallel conversion circuit 40 in synchronism with the changes of the levels "H" and "L" of the clock signal CK at times t1, t3, t5, . . . in FIG. 2. Thus, the data which change as D1, D2, D3, . . . in succession at the timings t2, t4, t6, . . . of the rises of the multiplied clock signal CKD are held in the flip-flop 41 of the serial/parallel conversion circuit 40, and they are delivered as the signal S41.

On the other hand, the signal S42 which changes as D1, D2, D3, . . . in succession at the times t4, t6, . . . with a delay of one clock cycle relative to the signal S41 is delivered from the flip-flop 42. The signals S41, S42 of the serial/parallel conversion circuit 40 are respectively supplied to the scan registers 21, 25.

The signals S41, S42 are respectively held in the scan registers 21, 25 at the timing of the rise of the clock signal CK at the time t5. Thus, the signals S21, S25 which are delivered from the scan registers 21, 25 become the data D2, D1, respectively.

At the rise of the clock signal CK at the time t7, the data D2, D1 are respectively shifted to the scan registers 22, 26, and the signals S21, S25 which are delivered from the scan registers 21, 25 become the data D4, D3, respectively.

At the rise of the clock signal CK at the time t8, the data D2, D1 are respectively shifted to the scan registers 23, 27, while the data D4, D3 are respectively shifted to the scan registers 22, 26, and the signals S21, S25 which are delivered from the scan registers 21, 25 become the data D6, D5, respectively.

At the next rise of the clock signal CK at the time t9, the data D2, D1 are respectively shifted to the scan registers 24, 28, the data D4, D3 to the scan registers 23, 27, and the data D6, D5 to the scan registers 22, 26. Besides, the signals S21, S25 which are delivered from the scan registers 21, 25 become the data D8, D7, respectively.

In this state, the signal S28 of the scan register 28 is selected by the selector 52 of the parallel/serial conversion circuit 50, and the signal S52 which is delivered from this selector 52 becomes the data D1.

When the multiplied clock signal CKD rises at the time t10, the signal S24 is held in the flip-flop 51 of the parallel/serial conversion circuit 50, and the signal S51 of this flip-flop 51 becomes the data D2. Besides, the test output data TO which is held in the flip-flop 53 and then outputted becomes the data D1.

When the clock signal CK becomes "L" at the time t11, the selector 52 is changed-over to the side of the flip-flop 51, and the signal S52 which is delivered from this selector 52 changes to the data D2.

When the multiplied clock signal CKD rises at the time t12, the signal S52 is held in the flip-flop 53, and the test output data TO of this flip-flop 53 becomes the data D2.

Owing to the operation as described above, the data D1, D2, D3, . . . are successively outputted as the test output data TO in synchronism with the rises of the multiplied clock signal CKD at and after the time t10.

By the way, in the normal operation mode of the semiconductor integrated circuit, the selectors of the respective scan registers 21-28 are changed-over to the first input nodes thereof by the mode signal MD, and the output signals of the logic circuit blocks 11-18 of the preceding stages are respectively supplied to the corresponding flip-flops. Thus, the logic circuit blocks 11-18 are respectively connected in cascade through the flip-flops of the scan registers 21-28, and a synchronized operation based on the clock signal CK is performed.

As described above, the semiconductor integrated circuit of the first embodiment is such that a scan chain based on the scan registers 21-28 which connect the logic circuit blocks 11-18 is divided in two, and that the respective chains are supplied with the test input data TI as converted into the parallel data by the serial/parallel conversion circuit 40, while the signals delivered in parallel from the respective chains as converted into the serial data by the parallel/serial conversion circuit 50 are outputted. Thus, there is the advantage that a time period which is required for writing the data into the respective scan registers 21-28 and reading the data out of these scan registers 21-28 can be reduced by half.

Second Embodiment

Figure 3:
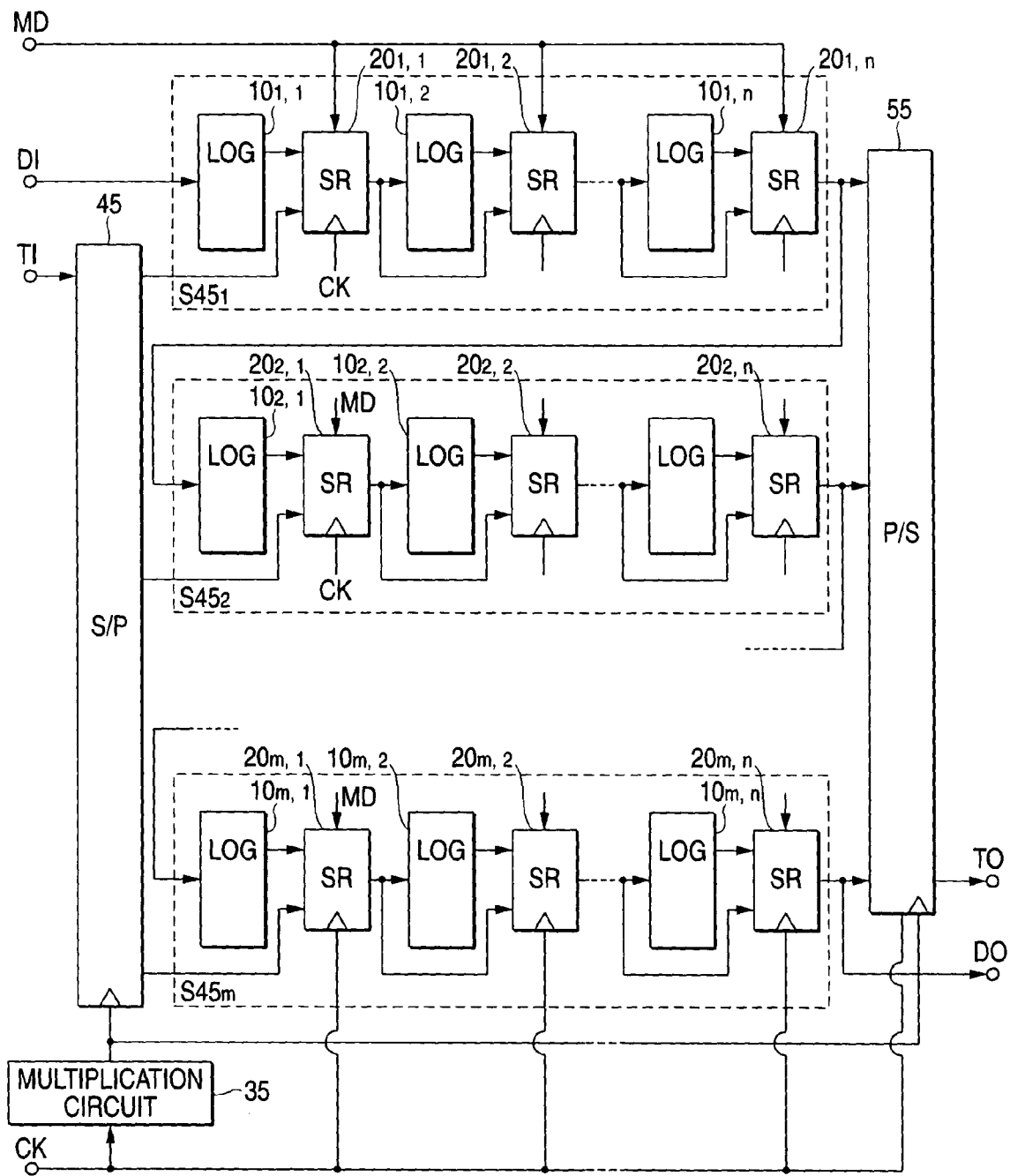
FIG. 3 is a block diagram of a semiconductor integrated circuit showing the second embodiment of the present invention.

FIG. 3 is a block diagram of a semiconductor integrated circuit showing the second embodiment of the present invention.

The semiconductor integrated circuit includes m×n logic circuit blocks $10_{i,j}$ (where i=1−m and j=1−n hold) which perform the functional operations of the integrated circuit, scan registers $20_{i,j}$ which are connected among the logic circuit blocks $10_{i,j}$, a multiplication circuit 35 which generates from a clock signal CK a multiplied clock signal CKD at a frequency being m times higher than that of the clock signal CK, a serial/parallel conversion circuit 45, and a parallel/serial conversion circuit 55.

The m×n logic circuit blocks $10_{i,j}$ as well as the scan registers $20_{i,j}$ are divided every n constituents, whereby m sets of divisional chain circuits are constructed.

The divisional chain circuit of the first set is so constructed that the logic circuit blocks $10_{1,1}$-$10_{1,n}$ are connected through the scan registers $20_{1,1}$-$20_{1,n-1}$, while the scan register $20_{1,n}$ is connected at a stage succeeding the logic circuit block $10_{1,n}$. The head logic circuit block $10_{1,1}$ is supplied with input data DI. Besides, the second input nodes of the scan registers $20_{1,2}$-$20_{1,n}$ at the second stage, et seq. are respectively supplied with the output signals of the scan registers $20_{1,1}$-$20_{1,n-1}$ at stages preceding them.

The divisional chain circuit of the ith set of or behind the second set has a substantially similar construction in which the logic circuit blocks $10_{i,1}$-$10_{i,n}$ are connected through the scan registers $20_{i,1}$-$20_{i,n-1}$ while the scan register $20_{i,n}$ is connected at a stage succeeding the logic circuit block $10_{i,n}$. Herein, the head logic circuit block $10_{i,1}$ is supplied with the output signal of the scan register $20_{i-1,n}$ of the divisional chain circuit of the (i−1)th set. Besides, the second input nodes of the scan registers $20_{i,2}$-$20_{i,n}$ at the second stage, et seq. are respectively supplied with the output signals of the scan registers $20_{i,1}$-$20_{i,n-1}$ at stages preceding them.

The serial/parallel conversion circuit 45 converts test input data TI serially inputted in synchronism with the multiplied clock signal CKD generated by the multiplication circuit 35, into m parallel data $S45_1$-$S45_m$, which are then delivered. The parallel data $S45_1$-$S45_m$ are respectively supplied to the second input nodes of the head scan registers $20_{i,1}$-$20_{m,1}$ of the divisional chain circuits of the corresponding sets.

On the other hand, the output signals of the tail scan registers $20_{1,n}$-$20_{m,n}$ of the divisional chain circuits of the corresponding sets are respectively supplied as parallel input signals to the parallel/serial conversion circuit 55. This parallel/serial conversion circuit 55 holds the parallel input signals on the basis of the timings of the clock signal CK, and it converts the held parallel input signals into serial signals and outputs the serial signals as test output data TO on the basis of the timings of the multiplied clock signal CKD.

In the normal operation mode of the semiconductor integrated circuit, the scan registers $20_{i,j}$ are changed-over to their first input nodes by a mode signal MD, and the output signals of the logic circuit blocks $10_{i,j}$ of the preceding stages are respectively held in the scan registers $20_{i,j}$ so as to be delivered to the logic circuit blocks $10_{i,j+1}$ etc. of the succeeding stages, in synchronism with the clock signal CK. Thus, the logic circuit blocks $10_{i,j}$ are respectively connected in cascade through the scan registers $20_{i,j}$, and a synchronized operation based on the clock signal CK is performed.

On the other hand, in the test operation mode, the scan registers $20_{i,j}$ are changed-over to their second input nodes by the mode signal MD. Thus, the logic circuit blocks $10_{i,j}$ are disconnected from the divisional chain circuits, and the divisional chain circuits in each of which the n scan registers $20_{i,1}$-$20_{i,n}$ are connected in cascade are connected in parallel in the m sets, between the serial/parallel conversion circuit 45 and the parallel/serial conversion circuit 55. Besides, m test input data as converted into the parallel data by the serial/parallel conversion circuit 45 are respectively supplied to the corresponding divisional chain circuits, and they are successively shifted in synchronism with the clock signal CK. Further, the output signals of the tail scan registers $20_{1,n}$-$20_{m,n}$ of the m sets of divisional chain circuits are supplied to the parallel/serial conversion circuit 55, and they are converted into the serial data in this parallel/serial conversion circuit 55 in accordance with the multiplied clock signal CKD so as to be outputted as the test output data TO.

As described above, the semiconductor integrated circuit of the second embodiment is such that a scan chain based on the scan registers $20_{i,j}$ which connect the logic circuit blocks $10_{i,j}$ is divided in m, and that the respective divisional chains are supplied with the test input data TI as converted into the parallel data by the serial/parallel conversion circuit 45, while the signals delivered in parallel from the respective divisional chains as converted into the serial test output data TO by the parallel/serial conversion circuit 55 are outputted. Thus, there is the advantage that a time period which is required for writing the data into the respective scan registers $20_{i,j}$ and reading the data out of these scan registers $20_{i,j}$ can be reduced to 1/m.

Incidentally, the present invention is not restricted to the foregoing embodiments, but various modifications are possible. Examples of the modifications are as follows:

(a) The construction of the scan registers 21, etc. is not restricted to the combination of the selector and the flip-flop as exemplified in FIG. 1.

(b) Although each embodiment includes the multiplication circuit 30 or 35 which generates the multiplied clock signal CKD by multiplying the clock signal CK, this multiplication circuit is unnecessary in a case where the multiplied clock signal CKD is supplied through a terminal from an external test device or the like.

As described above in detail, according to the first and third aspects of the invention, scan registers are divided every n logic circuit blocks, thereby to construct m sets of divisional chains, and test data are converted into m parallel data so as to supply the parallel data to the head scan registers of the respective divisional chains, in accordance with a multiplied clock signal. Thus, the length of each divisional chain becomes 1/m, and a time period for transferring the test data can be shortened.

According to the second and fifth aspects of the invention, the multiplied clock signal is generated by multiplying a clock signal. Thus, it is dispensed with to supply the multiplied clock signal from outside, and increase in the number of external terminals for a test can be suppressed.

According to the first and fourth aspects of the invention, data delivered from the respective tail scan registers of the m sets of divisional chains are converted into serial data so as to output the serial data, in accordance with the multiplied clock signal. Thus, one output terminal suffices for the test data, and increase in the number of external terminals for the test can be suppressed.

What is claimed is:

1. A semiconductor integrated circuit having an operational mode for processing operation input data and a test mode for processing test input data, comprising:

a plurality of scan registers that are operable in response to a clock signal and a mode signal, each scan register having an output terminal, an operation input data terminal, and a test input data terminal;

a plurality of logic circuits, each having an input terminal and having an output terminal that is connected to the operation input data terminal of one of the scan registers, the logic circuits and the scan registers being connected alternately in series to form m scan chains (wherein m is an integer greater than 1), the scan chains being connected to one another in a sequence, each of the scan chains including a first logic circuit, a first scan register connected to the first logic circuit, and a last scan register;

a serial/parallel conversion circuit connected to the test input terminals of the first scan registers of the scan chains, the serial/parallel conversion circuit converting serial test input data supplied during the test mode into parallel test input data in response to a multiplied clock signal having a frequency that is m times that of the clock signal, the parallel test input data being fed in parallel to the scan chains; and a parallel/serial conversion circuit connected to the output terminals of the last scan registers of the scan chains, the parallel/serial conversion circuit converting parallel data received from the scan chains into serial data in response to the multiplied clock signal, wherein the parallel/serial conversion circuit comprises a selector that receives the clock signal and selectively outputs processed test input data from the last scan registers of the scan chains in response to the clock signal during the test mode, and a flip-flop that receives the multiplied clock signal and latches output data from the selector in response to the multiplied clock signal, wherein operation input data is supplied to the sequence of scan chains via the input terminal of the first logic circuit in a first one of the scan chains in the operational mode, and wherein the flip-flop outputs processed operation input data from the sequence of scan chains during the operational mode.

2. A semiconductor integrated circuit according to claim 1, further comprising a multiplication circuit connected to the serial/parallel conversion circuit and the parallel/serial conversion circuit, the multiplication circuit receiving the clock signal and generating the multiplied clock signal based on the clock signal.

3. A semiconductor integrated circuit according to claim 1, wherein the serial/parallel conversion circuit includes a plurality of flip-flops connected in series, the flip-flops being operated in response to the multiplied clock signal.

4. A semiconductor integrated circuit according to claim 1, wherein the parallel/serial conversion circuit further includes at least one additional flop-flop that receives the multiplied clock signal.

5. A semiconductor integrated circuit according to claim 1, wherein each of the scan registers includes a selector and a flip-flop operated in response to the clock signal.

6. A semiconductor integrated circuit according to claim 1, wherein the output terminal of the last scan register of one of the scan chains is connected to the data input terminal of the first logic circuit of another one of the scan chains.

7. A semiconductor integrated circuit having an operational mode for processing operation input data and a test mode for processing test input data, comprising:

a plurality of scan chains that are connected to one another in a sequence, each scan chain including a first logic circuit having an input terminal and an output terminal, a first scan register having a test input terminal and having an operation input data terminal that is connected to the output terminal of the first logic circuit, and a last scan register having an output terminal, the scan registers being operated in response to a clock signal and a mode signal;

a serial/parallel conversion circuit connected to the test input terminals of the first scan registers of the scan chains, the serial/parallel conversion circuit converting serial test input data supplied during the test mode into parallel test input data in response to a multiplied clock signal having a frequency that is substantially equal to the number of scan chains times the frequency of the clock signal, the parallel test input data being fed in parallel to the scan chains; and a parallel/serial conversion circuit connected to the output terminals of the last scan registers of the scan chains, the parallel/serial conversion circuit converting parallel data received from the scan chains into serial data in response to the multiplied clock signal, wherein the parallel/serial conversion circuit comprises a selector that receives the clock signal and selectively outputs processed test input data from the last scan registers of the scan chains in response to the clock signal during the test mode, and a flip-flop that receives the multiplied clock signal and latches output data from the selector in response to the multiplied clock signal, wherein operation input data is supplied to the sequence of scan chains via the input terminal of the first logic circuit in a first one of the scan chains in the operational mode, and wherein the flip-flop outputs processed operation input data from the sequence of scan chains during the operational mode.

8. A semiconductor integrated circuit according to claim 7, further comprising a multiplication circuit connected to the serial/parallel conversion circuit and the parallel/serial conversion circuit, the multiplication circuit receiving the clock signal and generating the multiplied clock signal based on the clock signal.

9. A semiconductor integrated circuit according to claim 7, wherein the serial/parallel conversion circuit includes a plurality of flip-flops connected in series, the flip-flops being operated in response to the multiplied clock signal.

10. A semiconductor integrated circuit according to claim 7, wherein the parallel/serial conversion circuit further includes at least one additional flip-flop that receives the multiplied clock signal.

11. A semiconductor integrated circuit according to claim 7, wherein each of the scan registers includes a selector and a flip-flop operated in response to the clock signal.

12. A semiconductor integrated circuit according to claim 7, wherein the selectors of the scan registers are operated in response to a mode signal.

* * * * *